United States Patent [19]

Lawrence

[11] Patent Number: 5,622,875

[45] Date of Patent: Apr. 22, 1997

[54] METHOD FOR RECLAIMING SUBSTRATE FROM SEMICONDUCTOR WAFERS

[75] Inventor: John E. Lawrence, Cupertino, Calif.

[73] Assignee: Kobe Precision, Inc., Hayward, Calif.

[21] Appl. No.: 291,073

[22] Filed: Aug. 17, 1994

Related U.S. Application Data

[63] Continuation-in-part of Ser. No. 239,351, May 6, 1994, abandoned.

[51] Int. Cl.$^6$ ............................................. H01L 21/304
[52] U.S. Cl. .......................... 438/691; 451/41; 438/692; 438/977; 438/471
[58] Field of Search ........................... 156/636.1, 645.1; 437/225, 228, 10, 939, 974; 451/41, 287

[56] References Cited

U.S. PATENT DOCUMENTS

| | | | |
|---|---|---|---|
| 3,559,281 | 2/1971 | Mayberry et al. | 29/575 |
| 3,905,162 | 9/1975 | Lawrence et al. | 51/281 SF |
| 3,923,567 | 12/1975 | Lawrence | 156/7 |
| 4,276,114 | 6/1981 | Takano et al. | 156/636.1 |
| 4,663,890 | 5/1987 | Brandt | 51/283 R |
| 4,892,612 | 1/1990 | Huff | 156/636.1 |
| 5,409,770 | 4/1995 | Netsu et al. | 428/310.5 |
| 5,538,465 | 7/1996 | Netsu et al. | 451/397 |

FOREIGN PATENT DOCUMENTS 4346228  12/1992  Japan.

OTHER PUBLICATIONS

J.E. Lawrence, H.R. Huff, Silicon Material Properties For VLSI Circuitry, 1982, VLSI Electronics: Microstructure Science, vol. 5, pp. 51–102.

Correlation of Silicon Material Characteristics and Device Performance, J.E. Lawrence, American Microsystems, Inc., Santa Clara, California 95051, Reprinted from Semiconductor Silicon 1973, pp. 17–34.

Metallographic Analysis of Gettered Silicon, J.E. Lawrence, vol. 242, Mar. 1968, Transactions of The Metallurigical Society of AIME, pp. 484–489.

"Crystallographic Imperfections and Their Effect on Micro--Electronic Performance", J.E. Lawrence, pp. 52–57, Proceedings, Advanced Techniques in Failure Analysis Symposium 1976.

J.E. Lawrence, The Case For Reclaim Wafers, Reprinted from Electronic Packaging and Production, Jan. 1974, pp. 66–78.

J.E. Lawrence, Silicon Wafer Reclamation: A Processing Service, Reprinted from Electronic Packaging and Production Jul. 1975, p. 123.

"Test Wafer Manufacture", pp. 89–90.

Exsil Company Brochure.

Primary Examiner—R. Bruce Breneman
Assistant Examiner—Mathew Whipple
Attorney, Agent, or Firm—Oblon, Spivak, McClelland, Maier & Neustadt, P.C.

[57] ABSTRACT

A method of reclaiming a substrate wafer and a reclaimed substrate wafer. A semiconductor wafer having external layers from previous processing is reclaimed by etching the external layers and cup-wheel grinding an active surface of the wafer to remove semiconductor components such as diffused regions. Either the active surface or the backside of the wafer is then polished to a mirror finish to provide a highly crystalline surface. The cup-wheel grinding produces a pinwheel surface roughness pattern and is accomplished by grinding the wafer with a cup-shaped grinding wheel having an axis of rotation parallel to but offset from an axis of rotation of the wafer. Preferably, the rim of the cup-shaped grinding wheel always passes over the axis of rotation of the wafer.

23 Claims, 2 Drawing Sheets

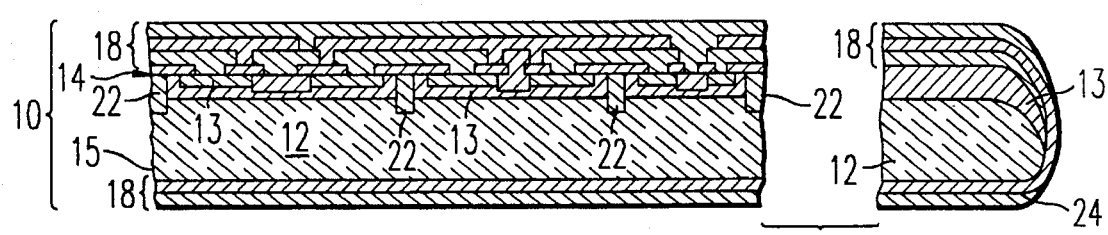
FIG. 1
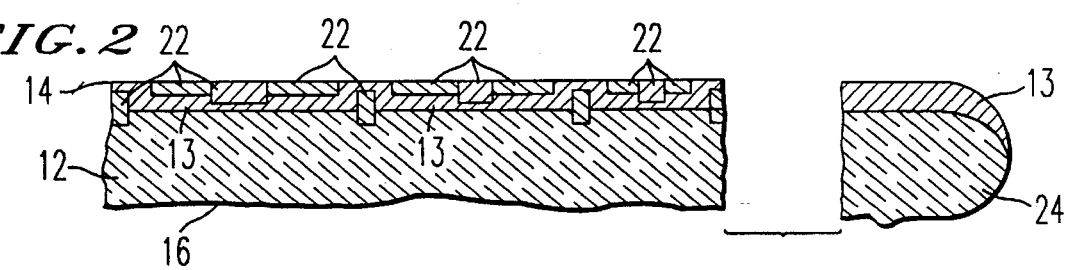
FIG. 2
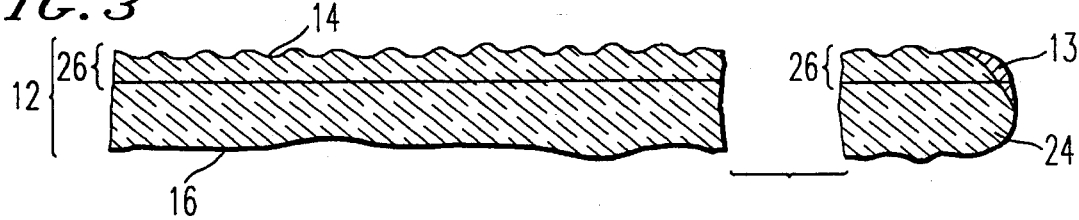
FIG. 3
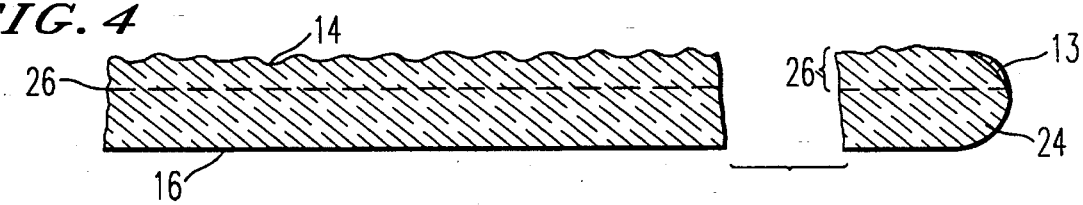
FIG. 4
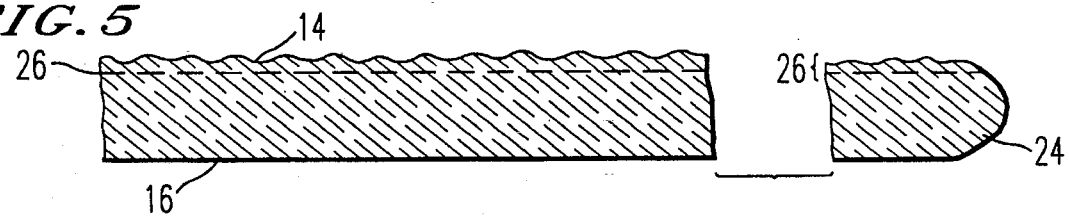
FIG. 5
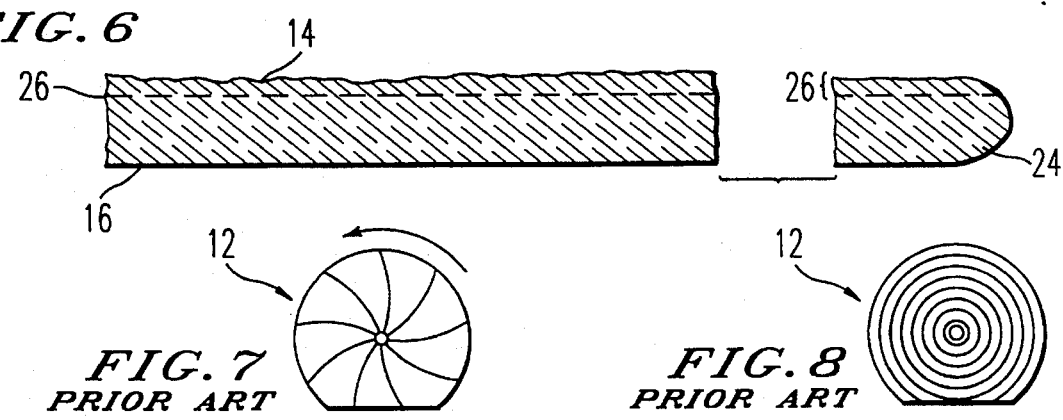
FIG. 6
FIG. 7 PRIOR ART
FIG. 8 PRIOR ART

METHOD FOR RECLAIMING SUBSTRATE FROM SEMICONDUCTOR WAFERS

The present application is a Continuation-in-part of prior application Ser. No. 08/239,351, filed on May 9, 1994, now abandoned.

BACKGROUND OF THE INVENTION

1. Field of the Invention

The invention relates generally to a method of reclaiming a substrate wafer from a semiconductor wafer. The reclaimed substrate wafer is of sufficiently high quality to meet many standards for "prime" wafer substrates used by the semiconductor circuit manufacturers.

2. Discussion of the Background

Semiconductor circuit manufacturers require two qualities of crystalline silicon wafers to satisfy their production requirements: "prime" quality wafers for use in constructing actual semiconductor products; and "test" quality wafers for use to prequalify manufacturing processes for their satisfactory performance, "Prime" wafers are sold to higher quality standards than "test" wafers. "Test" wafers that exhibit quality standards close to that of "prime" wafers are preferred by semiconductor companies and are sold at a higher price than standard quality "test" wafers, A typical used semiconductor wafer will comprise a silicon substrate wafer with semiconducting components implanted and/or diffused into one surface thereof (hereinafter called active surface) and layers of conducting and insulating materials formed on the surfaces of the silicon substrate wafer. There are several methods in the prior art for reclaiming substrate wafers from used semiconductor wafers.

In U.S. Pat. No. 3,559,281 issued to Mayberry et al, there is described a method of first removing the external conducting and insulating layers to expose the substrate wafer having semiconductor components diffused in an active surface thereof, followed by forming a passivation layer on the active surface of the substrate wafer. With this method the passive surface, i.e. that surface opposite the surface in which the semiconductor components are diffused, was adopted as the future working surface. This passivation layer was designed to keep the diffused impurities in the active surface of the silicon substrate wafer away from the future working surface. This method was not commercially successful because semiconductor manufacturers were fearful of the passivation layer becoming flawed with a resultant release of impurities to the working surface.

The method described in U.S. Pat. No. 3,923,567 employs a combination of gettering and etching steps to remove the impurities. In brief, it involved the diffusion of phosphorus into the surfaces of the stripped silicon substrate wafer at high temperatures. In this way getter sites were created in the regions near the surfaces and impurities were attracted towards these getter sites. It then employs an etching step to remove those undesired portions from the surface of the silicon substrate wafer. In this method the active surface was adopted as the future working surface and was polished. The surface opposite the polished surface i.e., the passive surface was then ground to introduce controlled amounts of crystalline lattice strain. This method produced a reclaimed silicon substrate of relatively high purity compared to the prior methods. However, due to the differential etching rate among different semiconductor components the etching process tended to create a wavy surface which meant that it was required to remove a considerably large amount of stock silicon in the subsequent polishing step, resulting in a silicon substrate wafer of significantly reduced thickness.

U.S. Pat. No. 3,905,162 describes a method of grinding for inducing controlled amounts of strain. However this grinding method was designed to be used as a finishing process in the production of substrate wafers prior to device fabrication and was not used as a method for removing the semiconducting components located within the substrate wafer. Furthermore the particular method of grinding described leaves a substrate wafer having a surface characterized by a "circular" surface roughness pattern. The reclaimed substrate wafer thus ground had the disadvantage that it tended to warp when subsequently subjected to a heat treatment by the semiconductor manufacturer.

The prior art also describes a method of wafer backside grinding used to remove hundreds of microns of silicon to transform a finished semiconductor product wafer of starting thickness near 650 microns to a final wafer thickness near 250 microns so that the wafer's semiconductor products will have a thickness compatible with the depth of the cavity of the product's final encapsulating package. Thus, the purpose of grinding in the back grinding application is different from those of the wafer reclamation procedure in that the back grinding procedure must remove vast amounts of material rapidly while resulting in a final wafer thickness without introducing significant crystal strain. The objectives of the back grinding procedure are met through using a combination of "coarse" abrasive grinding with a large particle size near 120 microns to remove silicon rapidly, followed by a "fine" abrasive grinding with a small particle size near five microns to remove much of the strained silicon. The objectives of the back grinding procedure cannot be met through the use of a single fixed abrasive wheel because the silicon removal rates would be too slow with a small particle abrasive, and the amount of crystal strain would be too great with a large particle abrasive.

Semiconductor manufacturers have now identified an industry need for high quality substrate wafers reclaimed from used semiconductor wafers. More specifically, it is desired that the reclaimed substrate wafers meet the strict flatness specifications for "prime" wafers, have designed in getter sites to keep impurities away from the working surface and have a thickness only slightly less than that of the original substrate wafer. None of the substrate wafers reclaimed by the above methods meet all these requirements.

SUMMARY OF THE INVENTION

It is an object of the present invention to provide a substrate wafer reclaimed from a semiconductor wafer which is capable of meeting the flatness specification for "prime" wafers, has designed-in selectively located "getter sites" and which does not warp when subjected to heating.

It is another object of the present invention to provide a process of reclaiming the above substrate wafer which involves a minimum number of steps and which requires removing only a minimal amount of stock silicon thereby producing a substrate wafer of only slightly less thickness than the original substrate wafer used to fabricate the semiconductor wafer.

It is a further object of the invention to provide a reclaimed substrate wafer having a first surface characterized by a "pinwheel" surface roughness pattern and a region adjacent to said first surface in which a controlled amount of crystal lattice strain has been introduced, and a second surface having a mirror-like finish.

It is a still further object of the present invention to provide a reclaimed substrate wafer that does not warp when subjected to a subsequent heat treatment.

These and other objects are achieved by a method of reclaiming a substrate wafer having an active surface, an opposite passive surface and one or more external layers, wherein the active surface has located therein one or more semiconductor components and the external layers are located on either the active surface or the passive surface, or both surfaces, the method includes the steps of removing the external layers from the wafer, cup-wheel grinding the active surface to remove the semiconductor components and provide a ground surface, etching the substrate, and grinding and/or polishing the passive surface.

These and other objects are also achieved by a reclaimed substrate wafer having a region of controlled lattice strain adjacent to a surface of the said substrate wafer and a pinwheel surface roughness pattern on this surface of the wafer. The opposite surface of the wafer is flat and has a mirror-like finish.

In the first embodiment of the method according to the invention, the surface of the substrate wafer opposite that surface from which the semiconductor components have been removed is adopted as the future working surface, and it is desirable that the region of the substrate wafer adjacent the ground surface have controlled amounts of lattice strain introduced therein. Such lattice strain serves to create "getter sites" which attract impurities within the substrate wafer and thus keep impurities away from the working surface.

In a second embodiment the active surface, the surface from which the semiconductor components have been removed, is to be adopted as the working surface. The cup-wheel grinding may use abrasive particles of relatively small particle size in order to effect a "fine" grind thereby removing the semiconductor components without introducing large amounts of crystalline strain. The small amounts of crystalline strain which are inevitably introduced even when a small size of abrasive particle is employed may be removed during a subsequent polishing step.

In the first and second embodiments, the surface to be adopted as the working surface i.e., either the passive surface or the active surface, is polished to produce a mirror-like surface.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1 is an elevated cross-sectional view of a used semiconductor wafer, including several layers of external conducting and insulating materials prior to the reclaiming process of the present invention;

FIG. 2 is an elevated cross-sectional view similar to FIG. 1 after the external layers of conducting and insulating materials have been stripped, thereby revealing the substrate wafer, in accordance with the process of the present invention;

FIG. 3 is an elevated cross-sectional view of the substrate wafer of FIG. 2 after the active side of the substrate wafer has been ground to remove the impurities, such as the semiconducting components, in accordance with a first embodiment of the present invention;

FIG. 4 is an elevated cross-sectional view of the substrate wafer of FIG. 3 after the passive surface of the substrate wafer has been ground to provide a very flat surface, in accordance with a first embodiment of the present invention;

FIG. 5 is an elevated cross-sectional view of the substrate wafer of FIG. 4 after the step of etching to remove silicon powder, edge wafer impurities and a surface layer of crystalline silicon having considerable lattice strain, in accordance with a first embodiment of the present invention;

FIG. 6 is an elevated cross-sectional view of the substrate wafer of FIG. 5 after the passive surface has been polished, in accordance with a first embodiment of the present invention;

FIG. 7 is a representation of the pinwheel surface roughness pattern left after grinding the active surface using a grinding method according to a first embodiment of the present invention;

FIG. 8 is a representation of the concentric circular surface roughness feature left on the surface of a reclaimed substrate after grinding of the surface according to the process described in U.S. Pat. No. 3,905,162;

DESCRIPTION OF THE PREFERRED EMBODIMENTS

Figure 10:
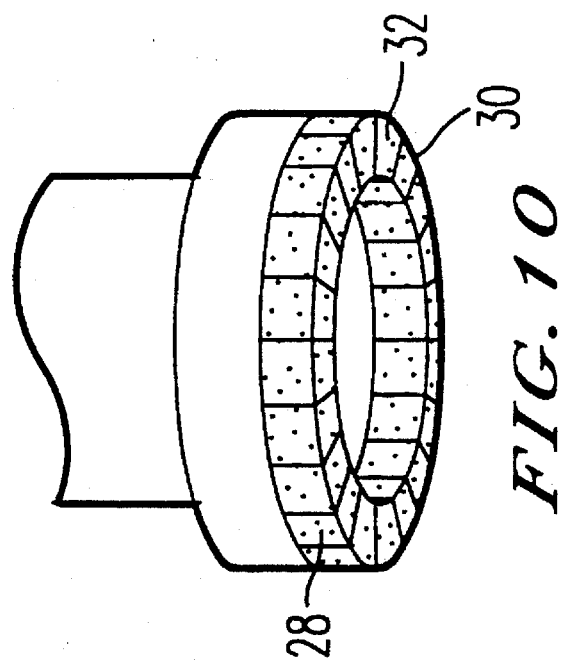
FIG. 10 is a diagram of a cup-shaped grinding wheel.

In the drawings, FIGS. 1–6 illustrate the structure of a reclaimed silicon semiconductor wafer at the various stages of the method of the present invention. The process commences with a previously processed semiconductor wafer, referred to by the general reference character 10, from which a silicon substrate wafer is to be reclaimed. The semiconductor wafer 10 may be a partially or completely processed semiconductor wafer that was rejected during manufacture; or a processed semiconductor wafer of a design which has become obsolete; or in any other form wherein the structure includes a silicon substrate wafer to be reclaimed by removing the unwanted structure.

As illustrated in FIG. 1, the semiconductor wafer 10 includes a silicon substrate wafer 12 having an active surface 14, and a passive surface 16 and edges 24. Passive surface 16 is shown as being uneven, which could be due to previous processing, warpage, or bowing. It is to be noted that passive surface 16 could also be flat. On the sides 14 and 16 and edges 24 are a plurality of layers of conducting and insulating materials 18, all external to the substrate wafer 12. Within the active surface 14 of the silicon substrate wafer 12 are an epitaxial layer 13, semiconductor components 22 which may include reactive ion trenches, selectively doped regions, etc. Thus, a typical semiconductor wafer 10 includes a substrate wafer 12, an epitaxial layer 13 with semiconductor components 22 located in an active surface 14 thereof, and external layers of insulating and conducting materials 18.

Next a process, according to a preferred embodiment of this invention, is described for reclaiming a silicon substrate wafer wherein passive surface 16 is to be adopted as the future working surface. This is typically the case when the used semiconductor wafer has been fabricated from a fresh silicon substrate wafer.

The first step in reclaiming the silicon substrate wafer involves removing the external conducting and insulating layers 18 from faces 14 and 16 and from wafer edges 24. This may be done, for example, chemically by immersing the semiconductor wafer 10 in various solutions, for example, hydrofluoric acid (HF), to dissolve the dielectrics such as silicon dioxide and silicon nitride as well as the conducting materials such as aluminum based metal systems. Another solution may be a mixture of $HF:HNO_3:HAc$ to dissolve layers of polysilicon that lie external to the silicon substrate wafer 12. The wafer immersion times may be between one to fifteen minutes in each solution depending on the external structure 18. The temperature of the solutions may be between twenty-two to sixty degrees Celsius. These solutions will remove most conducting and insulating layers 18 from the faces 14 and 16 and edges 24 of the silicon substrate wafer 12. The semiconductor wafer will now comprise a silicon substrate wafer with an epitaxial layer and semiconductor components located in an active surface thereof as shown in FIG. 2.

It is to be noted that the external layers may also be removed mechanically; they may for example be ground away. However, such an act may leave residuals of semiconductor components on the wafer edge.

The semiconducting components 22 located within the silicon substrate wafer 12 remain after removal of the external layers 18. These semiconducting components may include selectively doped silicon, reactive ion etched trenches, etc. It is important to remove these components 22 because their retention would limit the applications to which the reclaimed substrate wafer could be used. It is desirable to remove the semiconductor components 22 and the epitaxial layer 13 in a single step that preserves most of the original substrate wafer thickness, introduces controlled lattice strain as necessary and provides a flat substrate wafer.

These semiconductor components 22 and the portion of the epitaxial layer 13 on the active side of the wafer are removed by a method of cup-wheel grinding. This method of grinding not only removes the semiconductor components but also introduces controlled lattice strain as necessary to a region adjacent to the ground surface 14, and provides a flat surface while removing only a minimal amount of the stock silicon.

Next, the step of cup-wheel grinding shall be described in more detail with reference to FIGS. 9 and 10. A fixture 34, such as a vacuum chuck, for holding the substrate wafer 12 and rotating the held substrate wafer 12 about an axis is provided. First the fixture 34 is cleaned by a water rinse and brush scrub action. The substrate wafer 12 is then placed on the cleaned fixture 34 and the composite is rotated about an axis of rotation corresponding to an axis running through the center of the substrate wafer 12 and perpendicular to the substrate wafer 12. A cup-shaped rotary grinding wheel 28 having a rim 30 with abrasive particles 32, such as diamond particles, mounted thereon is rotated about an axis, parallel to but offset from the axis of rotation of the rotating substrate wafer 12. A cooling lubricant, for example deionized water is introduced to the substrate wafer 12 surface. The rotating grinding wheel 28 is then lowered to contact the active surface 14 of the rotating substrate wafer 12 with the rim 30 of the rotary grinding wheel 28 and a controlled force is applied to push the rotary grinding wheel 28 against the surface of the rotating substrate wafer 12. It is preferred that (i) the direction of rotation of the rotating substrate wafer 12 (indicated by arrow 36) is the same as the direction of rotation of the rotary grinding wheel 28 (indicated as arrow 38); (ii) the grinding wheel 28 has a diameter larger than the radius of the substrate wafer 12; (iii) the axes of the grinding wheel 28 and the rotating substrate wafer 12 are displaced such that the rim 30 of the grinding wheel 28 always passes through the axis of rotation of the rotating substrate wafer 12; and the grinding wheel 28 be rotated such that the rim 30 of the grinding wheel 28 has a linear velocity variable in the range of between 400 and 4000 m/min. While a selected linear velocity is used in the first embodiment, it is also possible to change the velocity during the step of cup-wheel grinding. For example, a higher velocity could be used at the beginning of the grinding operation, ending with a lower velocity to minimize the damage to the wafer.

Upon removing the targeted amount of silicon substrate wafer 12 containing the semiconductor components 22 and the epitaxial layer 13, the rotating rotary grinding wheel 28 is lifted away from the rotating substrate wafer 12.

The step of cup-wheel grinding is totally insensitive to the presence of the semiconductor components 22 within the active surface of the substrate wafer, and thus can remove the semiconductor components 22 without the unnecessary removal of excessive amounts of silicon substrate as well as creating a suitably flat surface. Furthermore, by adjusting the size of the abrasive particle 32 used in the cup-wheel grinding it is possible to control accurately the extent of lattice strain introduced into region of the substrate wafer adjacent the ground surface.

Figure 9:
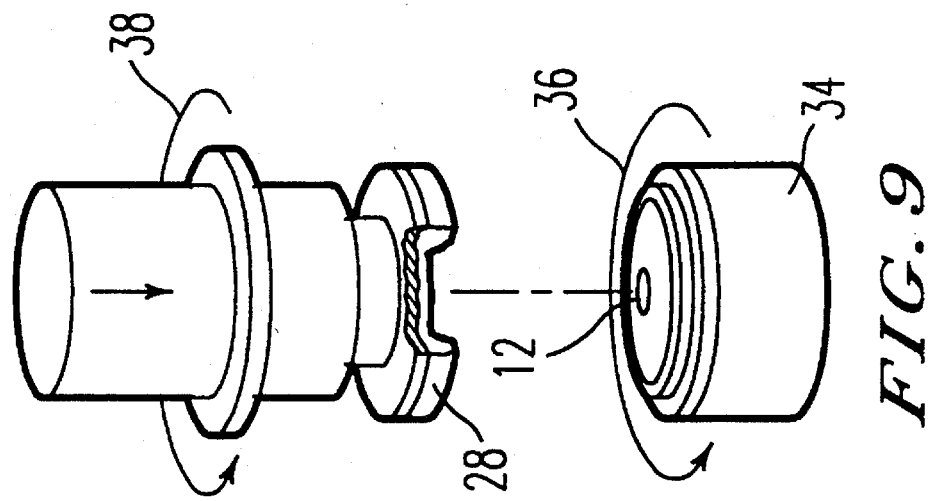
FIG. 9 is a diagram illustrating cup-wheel grinding according to the invention.

It should also be noted that the present invention is not limited to a particular grinding machine whose configuration is shown in FIGS. 9 and 10 being an example only. The step of cup-wheel grinding can be carried out by other means where the semiconductor components are removed and controlled amounts of lattice strain are introduced. The method according to the invention uses grinding equipment in a unique way requiring only cup-wheel grinding instruments on substrate wafer surfaces to remove a controlled minimal amount of silicon to create desired effects in the wafer crystalline lattice, dependent upon the size of the abrasive selected. For example, the side of the wafer having the semiconductor components therein will be ground in a single step using a "coarse" abrasive particle size in the range of 20 to 70 microns. This introduces the following desirable features in the reclaimed wafer: (1) only the portion of the wafer having the semiconductor components is removed; (2) controlled amounts of crystal strain are introduced into the wafer providing gettering of impurities; (3) the wafer is made very flat from edge to edge; and (4) a pinwheel pattern of local surface roughness is formed avoiding the radial distribution of lattice strain that may contribute to wafer warpage. As another example, the other side of the wafer may be ground in a single step using a "fine" abrasive particle size in the range of 4 to 6 microns, making the wafer very flat edge to edge while avoiding introducing excessive amounts of crystal strain.

Silicon powder generated upon the surface of the substrate wafer 12 during grinding may then be removed by rinsing the substrate wafer with, for example, deionized water, or it may be removed later in an optional etching step to be described later.

The substrate wafer 12 now has the structure shown in FIG. 3. It has a flat ground surface 14 and a region 26 adjacent to ground surface 14 with controlled crystalline strain therein introduced (thereby providing getter sites). Ground surface 14 also has a "pinwheel" surface roughness pattern which when viewed from above the surface is a pattern of the type depicted schematically in FIG. 7. The pinwheel surface roughness pattern consists of a number of grooves in the wafer surface emanating out from the center of the wafer, covering essentially the entire wafer surface.

The depth of the region of introduced crystal strain 26 is about seventy-five microns when an abrasive particle of a size about forty microns is used. It is observed through experiment that the depth of the region of crystal strain 26 introduced is about 1.8 times that of the size of abrasive particle selected. As shown in FIG. 3 and FIG. 4, the epitaxial layer 13 remains on the wafer edge after grinding. A subsequent etching step removes this layer.

The particle size used will depend on the substrate material but will generally be in the range of 4 to 200 microns. For a silicon substrate, abrasive particles having a particle size between 4 and 80 microns are used. It is to be noted that according to this embodiment, because the passive surface 16 is to be adopted as the working surface, a region of crystalline lattice strain adjacent to ground surface 14 is desirable and consequently a relatively large size of abrasive particle in the range of 20 to 200 microns is preferred. Such a size of particle will remove the semiconductor components 22 at a relatively fast rate as well as introducing controlled crystalline strain into a region adjacent ground surface 14.

For a silicon substrate wafer an abrasive particle having a size in the range of 20 to 80 microns is preferred. According to the method of this invention the exact size of abrasive particle may be selected according to the depth of lattice strain region desired. The random crystal lattice strain introduced into a region 26 functions to provide getter sites. This random crystal lattice strain will transform into dislocations near surface 14 when the semiconductor manufacturer subjects the substrate wafer to heat treatment. Unwanted mobile impurities in the substrate wafer will be drawn, by Cottrell attraction, to those dislocations i.e. away from the working surface, thus making the substrate wafer 12 insensitive to the harmful effects of such impurities.

The cup-wheel grinding can be easily controlled to remove only a targeted amount of substrate wafer 12 i.e. only that surface layer in which the semiconductor components 22 are located. The semiconductor manufacturer will have informed the substrate wafer reclaiming company of the depth to which the semiconductor components 22 extend in the object semiconductor wafer. The process of grinding the active surface 14 of the substrate wafer 12 to remove the semiconductor components is controlled to between one tenth to three microns per second by adjusting the force with which the grinding wheel 28 is applied against the rotating substrate wafer 12. Apparatus such as that described in an article appearing in the August 1993 edition of "Solid State Technology" entitled "Precision Grinding of Semiconductor Wafers" and authored by Hubert Hinzen et al may be used to carry out the type of cup-wheel grinding described above.

Next, depending on the cleanliness and roughness of the passive surface 16, passive surface 16 of the substrate wafer may be finely ground to achieve a very flat surface without introducing excessive crystal strain. This can be accomplished using the same grinding procedure as described in connection with the grinding of active surface 14, but differs in that a grinding tool having abrasive particles of a smaller size is used. A grinding tool with an abrasive particle size in the range of 4 to 8 microns provides for a very flat surface with the introduction of only minimal crystal strain. It is possible using such a fine grinding process to attain a surface that exhibits a flatness feature of four microns from diametric edge to edge of the substrate wafer. Grinding tools with abrasive particles of sizes less than 4 microns are not very effective because of their tendency to become clogged with silicon powder, while grinding tools with abrasive particles of sizes greater than 20 microns tend to introduce excessive crystal strain. The introduction of crystal strain in the surface region adjacent passive surface 16 is undesirable because, as mentioned at the beginning of this description, in this case passive surface 16 is to be adopted as the working surface by the semiconductor manufacturer.

Lattice strain in the working surface of a silicon wafer may contribute to the reclaim "test" wafer failing to provide accurate manufacturing process monitoring data. The "fine" ground surface will inevitably acquire small amounts of crystal strain near the ground surface and will also have silicon powder accumulated thereupon. These may be removed in a subsequent step.

The next step of the first embodiment as illustrated in FIG. 5 is to chemically etch the substrate wafer 12 to remove undesired silicon powder accumulated on surfaces 14 and 16 during the grinding steps. Etching also has the advantage of removing an unwanted top surface layer of silicon having considerable crystalline strain. Still another advantage is that the etching removes impurities from the wafer edge. The chemical etch may be conducted using a KOH or an HF:HNO$_3$:HAc-type solution at temperatures of between twenty to sixty degrees Celsius. The time of etching may be from between one minute to eight minutes to remove a targeted layer of silicon from one to five microns in depth from each side. Crystalline strain within six microns of the passive surface 16 need not be removed because a layer of about six microns in thickness will be removed from passive surface 16 in the next process step. FIG. 5 illustrates the appearance of the substrate wafer 12 after surfaces 14 and 16 have been etched. The region 26 of introduced crystalline strain adjacent ground surface 14 now has a smaller thickness.

The final step, as illustrated by FIG. 6, transforms the "fine" ground passive surface 16 of the substrate wafer 12 into a strain-free highly polished surface with a mirror-like finish. This is accomplished through the use of a slurry-based chemical-mechanical polishing process. In the slurry, abrasive silica is colloidally suspended. The slurry is alkaline and preferably has a pH of between ten to twelve to thereby control the chemical component of the polishing process. The slurry is used in conjunction with a rotating polishing pad having a felt-like texture. The substrate wafer 12 is rotated and the rotating polishing pad with the slurry applied thereto is applied against passive surface 16 of the substrate wafer 12 at a controlled pressure. The removal of about six to eight microns of the substrate wafer 12 from the passive surface 16 will generally achieve the desired strain-free highly polished surface with a mirror-like finish.

It is to be noted that the steps of fine grinding the passive surface 16 and etching the substrate wafer to remove silicon powder are preferred but not essential steps. It should also be noted that the passive surface may have some surface damage, for example from previous grinding to introduce gettering sites, which should be removed. This surface damage can be removed by grinding, polishing, or etching, or a combination of these steps. A minimal amount of the substrate wafer 12 should be consumed in removing the surface damage on passive surface 16.

FIG. 6 illustrates a cross-section of the finished substrate wafer 12 that has been reclaimed by the process of this invention. The reclaimed substrate wafer 12 has a strain-free highly polished flat passive surface 16, a ground surface 14, a crystalline strained region 26 of silicon adjacent to ground surface 14 and a "pinwheel" surface roughness pattern on ground surface 14. The pinwheel surface roughness pattern prevents the wafer from warping when subjected to heat treatment processes, such as when the reclaimed wafer is used to manufacture semiconductor components, because the pinwheel pattern disperses residual strain in both the radial and circumferential direction of the wafer caused by grinding.

Although the description has been focused on semiconductor wafers comprising substrates of silicon, the process, may be utilized in the reclamation of substrates of other materials such as sapphire and III–V materials. The present invention provides a low-cost high-yield process for reclaiming substrate wafers from previously used or rejected semiconductor wafers. It avoids the introduction of uncontrolled crystalline strain but allows enough strain to be strategically introduced into the substrate wafer to getter unwanted impurities away from the working surface. Using the process of this invention, reclaimed substrate wafers being sufficiently flat to pass the quality requirement for "prime" wafers can be obtained. Furthermore, the amount of substrate removed is so slight that a semiconductor wafer constructed from a substrate wafer reclaimed according to the process of this invention can be repeatedly reclaimed.

In the process according to the first embodiment of this invention, the passive surface is to be adopted as the future working surface. In a second embodiment, the active surface may be adopted as the future working surface. For example, when the used semiconductor wafer is a semiconductor wafer fabricated from a substrate wafer reclaimed according to the process described above, passive surface 16 will have a region of introduced crystalline lattice strain adjacent thereto. If the depth to which the semiconductor components are formed is not too deep, it may be deemed more efficient, in terms of conserving the thickness of the substrate wafer, to adopt ground surface 14 as the future working surface. In such a case, the active surface 14 should be ground employing an abrasive particle of a relatively small size in the range of 4 to 8 microns. By using such a small size of abrasive particle the semiconductor components can be removed without introducing large amounts of crystalline strain. The small amount of strain that is unavoidably introduced is then removed by polishing ground surface 14, as described above.

The wafer according to the first example of the second embodiment has a pinwheel surface roughness pattern on both surfaces after the grinding of the active and passive surfaces. In a second example, either of the surfaces may be ground, etched, and/or polished to obtain the mirror-like surface. The surface selection may be based on a visual inspection or the surface roughness. The surface which is the easier to polish is selected as the new active surface.

In a third example, the wafer to be reclaimed contains no semiconductor components located in the active surface. In this case, the active surface may be selected as the new active surface, and is ground, etched, and/or polished as described above to obtain the strain-free mirror-like surface. If desired, the passive surface can be ground using the cup-wheel grinding step described above to obtain the pinwheel surface roughness pattern, and the accompanying advantages.

In a fourth example, the wafer to be reclaimed is a wafer previously reclaimed by the process according to the first embodiment with no semiconductor components located in the active surface. Thus, the passive surface will have the pinwheel surface roughness pattern. In this case, the active surface may also be selected as the new active surface, and is ground, etched, and/or polished as described above to obtain the strain-free mirror-like surface.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as falling within the true spirit and scope of the invention.

What is claimed as new and is desired to be secured by Letters Patent of the Unites States is:

1. A process for preparing a reclaimed substrate wafer from a semiconductor wafer, wherein said semiconductor wafer comprises a substrate wafer having an active surface, an opposite passive surface and one or more external layers, wherein said active surface has located therein one or more semiconductor components and wherein said external layers are located on at least one of the active surface and the passive surface, said process comprising the steps of:

removing said external layers from said substrate wafer;

subsequent to said removing step, cup-wheel grinding the active surface to remove said semiconductor components and provide a ground surface;

polishing at least one of said passive and said ground surface.

2. The process according to claim 1, wherein said step of cup-wheel grinding said active surface comprises the steps of:

rotating said substrate wafer about an axis; and contacting said active surface of said rotating substrate wafer with a grinding wheel having abrasive particles mounted at its outer edge thereupon rotating about an axis parallel to but displaced from the axis of rotation of said rotating substrate wafer.

3. The process according to claim 2, wherein said step of cup-wheel grinding comprises grinding said substrate wafer with said grinding wheel having abrasive particles with a particle size in a range of 4 to 200 microns mounted thereon.

4. The process according to claim 2, wherein said step of cup-wheel grinding comprises grinding said substrate wafer with said grinding wheel having abrasive particles with a particle size in a range of 4 to 200 microns; and wherein step of polishing comprises polishing said passive surface.

5. The process according to claim 4, further comprising the step of grinding said passive surface before the step of polishing said passive surface.

6. The process according to claim 5, wherein said step of grinding said passive surface comprises the steps of:

rotating said substrate wafer about an axis;

contacting said passive surface of said rotating substrate wafer with a grinding wheel having abrasive particles of a particle size in a range of 4 to 200 microns mounted at its outer edge thereupon rotating about an axis parallel to but displaced from the axis of rotation of said rotating substrate wafer.

7. The process according to claim 2, wherein said step of cup-wheel grinding comprises grinding said substrate wafer with said grinding wheel having abrasive particles with a particle size in a range of 4 to 8 microns; and wherein said step of polishing comprises polishing said ground surface.

8. The process according to claim 2, wherein said step of contacting comprises contacting said active surface of said rotating substrate wafer with a cup-wheel instrument having diamond particles mounted thereupon.

9. The process according to claim 2, wherein said step of cup-wheel grinding comprises:

grinding said active surface using a cup-shaped grinding wheel having said abrasive particles mounted on a rim of said cup-shaped wheel; and contacting said rim with said rotating substrate wafer.

10. The process according to claim 9, wherein said step of cup-wheel grinding comprises rotating said cup-shaped wheel such that said rim of said cup-shaped wheel has a linear velocity variable in the range of about 400 to 4000 meters per minute.

11. The process according to claim 9, wherein said step of cup-wheel grinding comprises rotating said cup-shaped wheel in the same direction as that of said rotating substrate wafer.

12. The process according to claim 9, wherein said step of cup-wheel grinding comprises passing said rim of said cup-shaped wheel over the axis of rotation of said rotating substrate wafer.

13. The process according to claim 2, comprising rotating said substrate wafer by mounting the substrate wafer on a vacuum chuck and then rotating said vacuum chuck with said substrate wafer mounted thereon.

14. The process according to claim 1, further comprising etching said ground surface.

15. The process according to claim 1, wherein said polishing step is a chem-mechanical-polishing step.

16. The process according to claim 15, wherein said chem-mechanical-polishing step employs an alkaline slurry.

17. The process according to claim 16, wherein said alkaline slurry has a pH of between 10 and 12.

18. The process according to claim 1, wherein said step of removing at least one of said external layers is performed chemically.

19. The process according to claim 2, further comprising applying a coolant fluid to said rotating substrate wafer.

20. The process according to claim 1, further comprising rinsing said substrate wafer to remove silicon powder generated during said step of cup-wheel grinding said active surface.

21. The process according to claim 1, wherein said step of cup-wheel grinding comprises producing a pinwheel-shaped surface roughness pattern.

22. The process according to claim 1, wherein said step of cup-wheel grinding comprises grinding said active surface to remove only a portion having said semiconductor components located therein.

23. The process according to claim 22, wherein said step of cup-wheel grinding comprises producing a strained lattice region in said semiconductor wafer.

* * * * *